(12) United States Patent
Garzarolli et al.

(10) Patent No.: US 10,816,403 B2
(45) Date of Patent: Oct. 27, 2020

(54) COLOR SENSOR AND METHOD OF ITS PRODUCTION

(71) Applicant: Integrated Device Technology, Inc., San Jose, CA (US)

(72) Inventors: Matthias Garzarolli, Dresden (DE); Thomas Reichel, Dresden (DE)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/312,985

(22) PCT Filed: Jul. 4, 2017

(86) PCT No.: PCT/EP2017/066597
§ 371 (c)(1),
(2) Date: Dec. 21, 2018

(87) PCT Pub. No.: WO2018/007368
PCT Pub. Date: Jan. 11, 2018

(65) Prior Publication Data
US 2019/0170584 A1    Jun. 6, 2019

(30) Foreign Application Priority Data

Jul. 5, 2016    (DE) .......... 10 2016 112 248

(51) Int. Cl.
*G01N 21/25* (2006.01)
*G01J 3/51* (2006.01)
(Continued)

(52) U.S. Cl.
CPC ............. *G01J 3/513* (2013.01); *G01J 3/0227* (2013.01); *G02B 5/285* (2013.01); *G02B 5/286* (2013.01); *H01L 27/14621* (2013.01)

(58) Field of Classification Search
CPC ........ G01J 3/513; G01J 3/0227; G02B 5/285; G02B 5/286; G02B 5/20; G02B 5/22;
(Continued)

(56) References Cited

U.S. PATENT DOCUMENTS

| 4,547,074 A | 10/1985 | Hinoda et al. |
| 2006/0146330 A1 | 7/2006 | Selvan et al. |

(Continued)

FOREIGN PATENT DOCUMENTS

WO    2015195123 A1    12/2015

OTHER PUBLICATIONS

International Search Report and Written Opinion issued by the International Searching Authority dated Oct. 25, 2017 for PCT Application No. PCT/EP2017/066597. pp. 1-10.

*Primary Examiner* — Abdullahi Nur
(74) *Attorney, Agent, or Firm* — Haynes and Boone, LLP

(57) ABSTRACT

Embodiments of the invention relate to a method for producing a color sensor with a sensor characteristic adjusted by three sensor elements that each comprise an element characteristic, and a color filter cooperating with the sensor elements and consisting of color filter elements that each comprise a filter element characteristic, and to a color sensor. Embodiments include a method with which a color sensor with a precisely adjustable sensor characteristic can be produced from several photosensitive elements and from simple filter elements is solved in that the particular filter element characteristics are adjusted in such a manner that they have in cooperation with the respective element characteristic an interim characteristic of the sensor which deviates from the sensor characteristic on the whole, wherein the sensor characteristic is generated from the interim characteristic by a transformation algorithm using transformation parameters.

7 Claims, 7 Drawing Sheets

(51) Int. Cl.
*G01J 3/02* (2006.01)
*G02B 5/28* (2006.01)
*H01L 27/146* (2006.01)

(58) Field of Classification Search
CPC ............... G02B 5/28; H01L 27/14621; H01L 27/14643; H01L 31/0232; H01L 31/02165
See application file for complete search history.

(56) References Cited

U.S. PATENT DOCUMENTS

| | | | |
|---|---|---|---|
| 2011/0204463 A1* | 8/2011 | Grand | G02B 5/201 257/432 |
| 2016/0273958 A1* | 9/2016 | Hoenk | H01L 31/107 |

* cited by examiner

COLOR SENSOR AND METHOD OF ITS PRODUCTION

RELATED APPLICATIONS

This patent application is a U.S. National Stage patent application of International Patent Application No. PCT/EP2017/066597, filed on Jul. 4, 2017, which claims priority to German Patent Application No. 10 2016 112 248.3, filed on Jul. 5, 2016, each of which is incorporated by reference herein in its entirety.

Embodiments of the invention relate to a color sensor and a method of its production.

DISCUSSION OF RELATED ART

In order to determine color locations, sensors are required for determining the "tristimulus values={X,Y,Z}". The concept "tristimulus" denotes the three base values X, Y and Z for the characterization of the color locations. Each color can be characterized with such a value in order to establish a relation between the human perception of color (color) and the physical causes of the color stimulation (color valence). Color temperatures, etc. can be derived from the color location.

The spectra of a tristimulus sensor (CIE1931) are shown in FIG. 1. It shows the CIE-standardized sensitivity curves of the tristimulus curves: X (dotted—red channel), Y (dash-dots—green channel) and Z (dashes—blue channel).

Traditional Si photodiodes have the spectral sensitivities shown in FIG. 2.

In order to realize an XYZ ("tristimulus") sensor from photodiodes, different optical coatings/filters are required for the individual photodiodes. Usually, dicroic interference filters are used for such filters in order to imitate the required spectral course. These filters have many layers (often more than 100) and/are cost-intensive to produce; however, desired sensor characteristics can be adjusted with these individually produced filters.

As an alternative to the normal interference filters, so-called "Induced Transmission Filters (IDF)" can be used which have distinctly fewer filter layers, are therefore more economical to produce and have a lower dependency on the angle of incidence. However, at the present time no complex filters with the required preciseness for an XYZ color sensor can be realized with these more economical IDF filters. Primarily simple, optical band passes, high passes and low passes can be realized with these filters. This represents a problem in particular for the X channel with the 2 wavelength peaks for the red color channel at approximately 440 nm and 600 nm (see FIG. 1—shown in dots). That is, not every desired sensor characteristic can be realized with the ITF filters, which are simple to produce, in combination with the sensor elements but rather precisely the desired sensor characteristic cannot be realized by such filters with the particular filter characteristic.

FIG. 3 shows a color sensor from the prior art. Sensor elements, e.g. photodiodes are integrated in a silicon wafer and are arranged optically separated from one another horizontally by metallic layer stacks and dielectrics wherein filter elements are arranged on the wafer surface in front of the sensor elements and which transmit only predetermined spectral wavelengths onto the sensor element underneath according to their filter characteristic. Each sensor element is a measuring channel which is connected to a processing unit (not shown).

SUMMARY

A method for producing a color sensor with a sensor characteristic which is adjusted by three sensor elements which each comprise an element characteristic, and a color filter cooperating with the sensor elements and consisting of color filter elements which each comprise a filter element characteristic, characterized in that the particular filter element characteristics are adjusted in such a manner that they have in cooperation with the respective element characteristic an interim characteristic of the sensor which deviates from the sensor characteristic on the whole, wherein the sensor characteristic is generated from the interim characteristic by a transformation algorithm using transformation parameters.

Embodiments of the invention will be explained in detail in the following using a few exemplary embodiments.

DESCRIPTION OF THE FIGURES

In the figures

FIG. 5 shows the sensor output values of a color sensor, wherein an additional channel was used for the blue component in order to compensate spectral process fluctuations, in particular of the green channel, as is also shown in FIG. 5 with and without compensation.

FIG. 6 shows the spectral course of the Y channel without compensation and with a compensation by the red and blue sensor element channel. The additional Z channel (blue channel) helps at 500 nm, as is shown in FIG. 4, to achieve a spectral compensation and/or shift.

FIG. 7 shows the spectral course of each of an additional red, green and blue color channel. In order to improve all channels, 3 XYZ channels, not only in amplitude but also as regards the spectral shift, other color channels are required with a wavelength below the blue channel and one above the red channel.

FIG. 8 (without compensation) shows the spectral course of a CIE-SYZ color sensor with the spectral shift without a compensation of this shift, in contrast to which FIG. 8 (with compensation) shows the same signal signals only with a multispectral compensation of the color channel signals.

DETAILED DESCRIPTION

Figure 1:
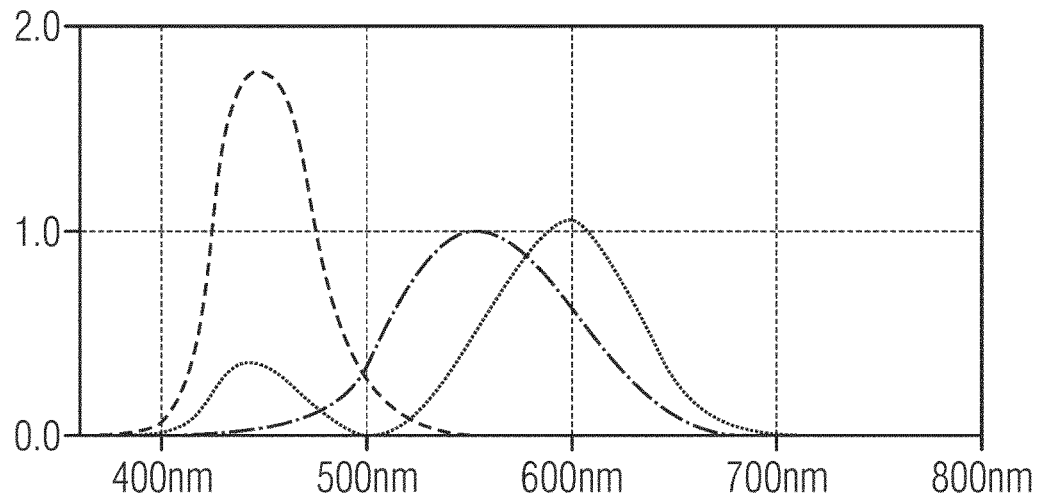
FIG. 1 shows spectra of a tristimulus sensor (CIE1931) (prior art)
Figure 2:
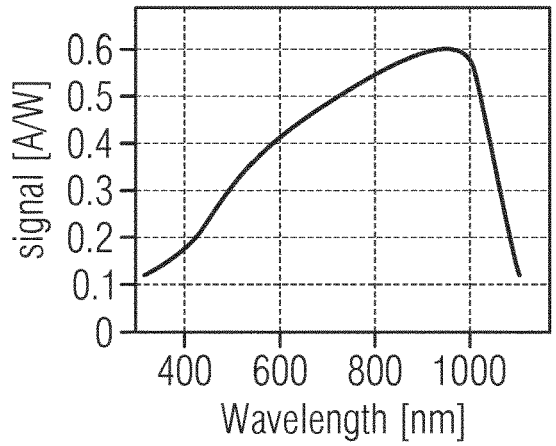
FIG. 2 shows spectral sensitivity of traditional Si photodiodes (prior art)

Embodiments relate to a method for producing a color sensor with a sensor characteristic that is adjusted by three sensor elements, each comprising an element characteristic, and for producing a color filter cooperating with the sensor elements and consisting of color filter elements, each comprising a filter element characteristic.

Embodiments of the invention also relates to a color sensor with a sensor characteristic comprising three sensor elements, to an optical filter element arranged on each sensor element, wherein each optical filter element comprises a plurality of dielectric and metallic layers which are arranged alternating on each other, and to a processing unit, wherein the sensor elements, the filter elements and the processing unit are constructed integrated on a chip.

Embodiments of the invention therefore has the problem of indicating a method with which a color sensor with a precisely adjustable sensor characteristic can be produced from several photosensitive elements and from simple filter elements.

The invention also has the problem of making a color sensor available which can be produced in a simple manner and has a desired sensor characteristic in spite of the using of more economical ITF filters.

The problem is solved on the method side in that the particular filter element characteristics are adjusted in such a manner that they have in cooperation with the respective element characteristic an interim characteristic of the sensor which deviates from the sensor characteristic on the whole, wherein the sensor characteristic is generated from the interim characteristic by a transformation algorithm using transformation parameters.

A color sensor comprises of at least three sensor elements. Each sensor element has an element characteristic, i.e., an element-specific measuring signal course resulting from a detected radiation which strikes the particular sensor element. A color filter is arranged in front of each sensor element so that only certain, desired radiation components strike the particular sensor element. A color filter consists here of color filter elements which each have a filter element characteristic. A filter element characteristic is specific to the filter element, i.e., each filter element has individual properties on account of its production process, e.g., on account of variations in the production process of the filter element. The combination of element characteristic and filter element characteristic together form an interim characteristic of the particular color sensor in its entirety. However, because this interim characteristic does not yet have the final sensor characteristic and therefore deviates from the desired sensor characteristic, the desired sensor characteristic is generated by a transformation algorithm using transformation parameters.

The desired sensor characteristic is a spectral course required by the client which a color sensor should have. The using of expensively produced, dicroic interference filters can be avoided with the method of the invention since normal ITF filters can be used which comprise significantly fewer filter layers in order that they can be produced distinctly more economically, wherein the latter purposefully still do not have the filter element characteristic which realizes the desired sensor characteristic. Therefore, it is possible to purposefully do without a complicated filter production which would realize the desired sensor characteristic.

Correction values are determined for a color sensor produced in this manner which are stored in the form of transformation parameters and by using which the desired sensor characteristics can be set by a transformation algorithm. I.e., the sensor signal is transformed by the transformation algorithm and the transformation parameters to the intended sensor signal.

It is advantageous that readily reproducible ITF filters can be used by the method of the invention in order to produce the color sensor in a simple and economical manner which has a client-specific sensor characteristic. Therefore, the method of the invention is suitable for generating a desired, resulting sensor signal and trimming or correcting it even in particular as regards production-conditioned process fluctuations.

In an advantageous embodiment of the method of the invention the color filter consisting of color filter elements is produced from dielectric and metallic layers alternately arranged on each other. The number of layers is substantially less than that of dicroic filters, which often comprise more than 100 layers.

In another advantageous embodiment of the method of the invention the transformation algorithm and the transformation parameters are generated from a simulation of the desired sensor characteristic. The transformation parameters can be determined by the known filter element characteristics and the element characteristics using simulations, wherein different sensor characteristics can be adjusted in this manner for color sensors which were produced in a common production process.

Figure 4A:
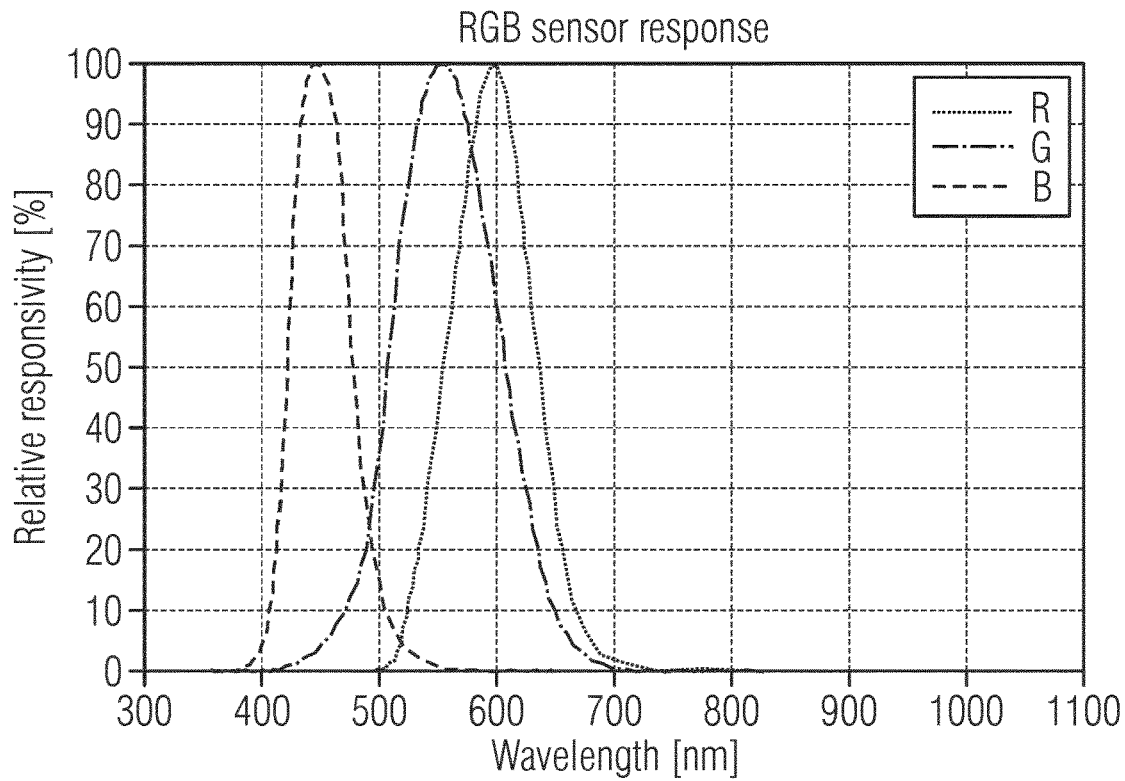
FIG. 4 (consisting of FIGS. 4A and 4B) shows a) non-weighted sensor signals of the individual sensor measuring channels; b) weighted sensor signals of the individual sensor measuring channel.
Figure 4B:
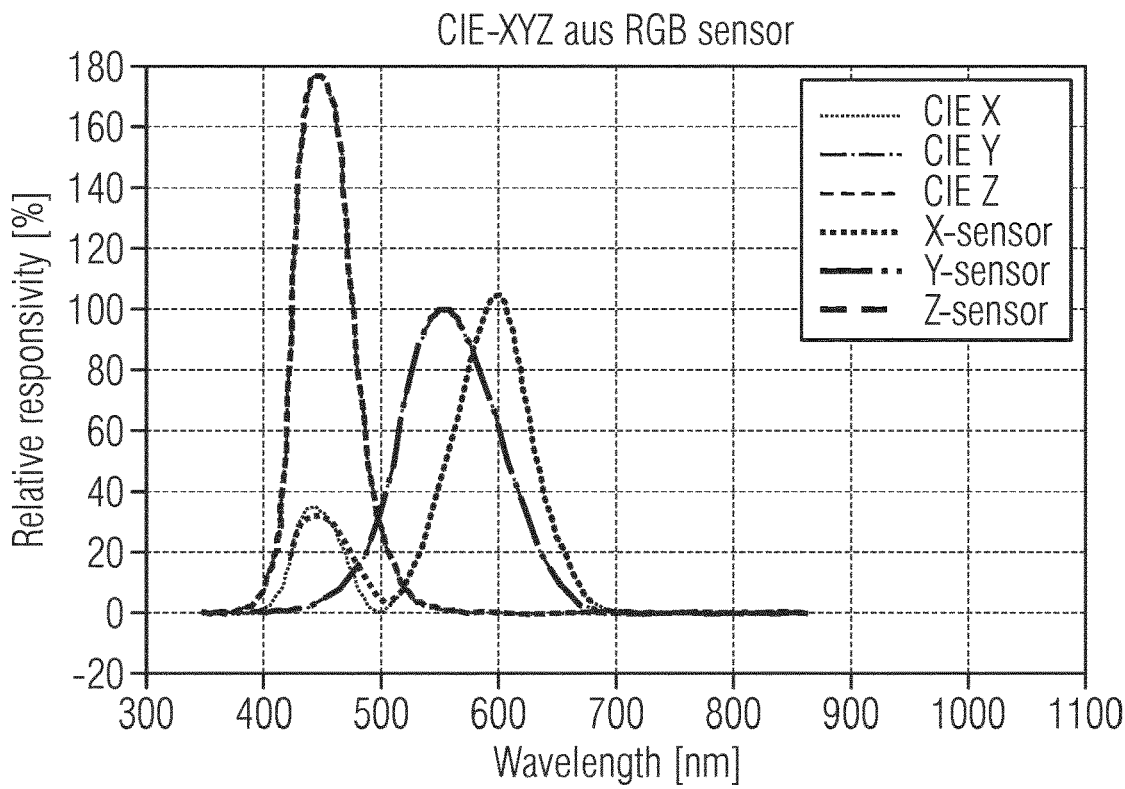
Figure 5:
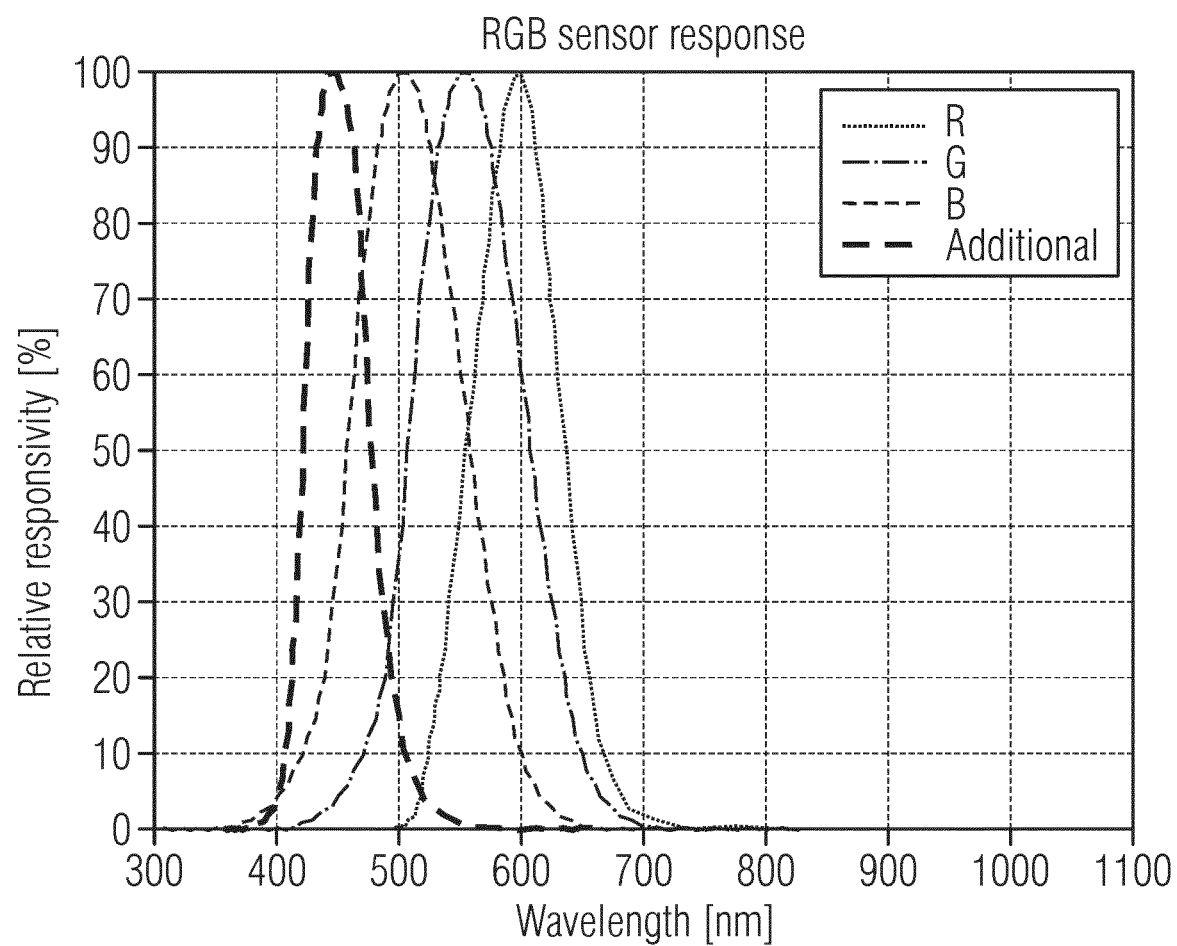
FIG. 5 shows sensor output values of the color sensor with an additional channel for the blue radiation component.
Figure 6:
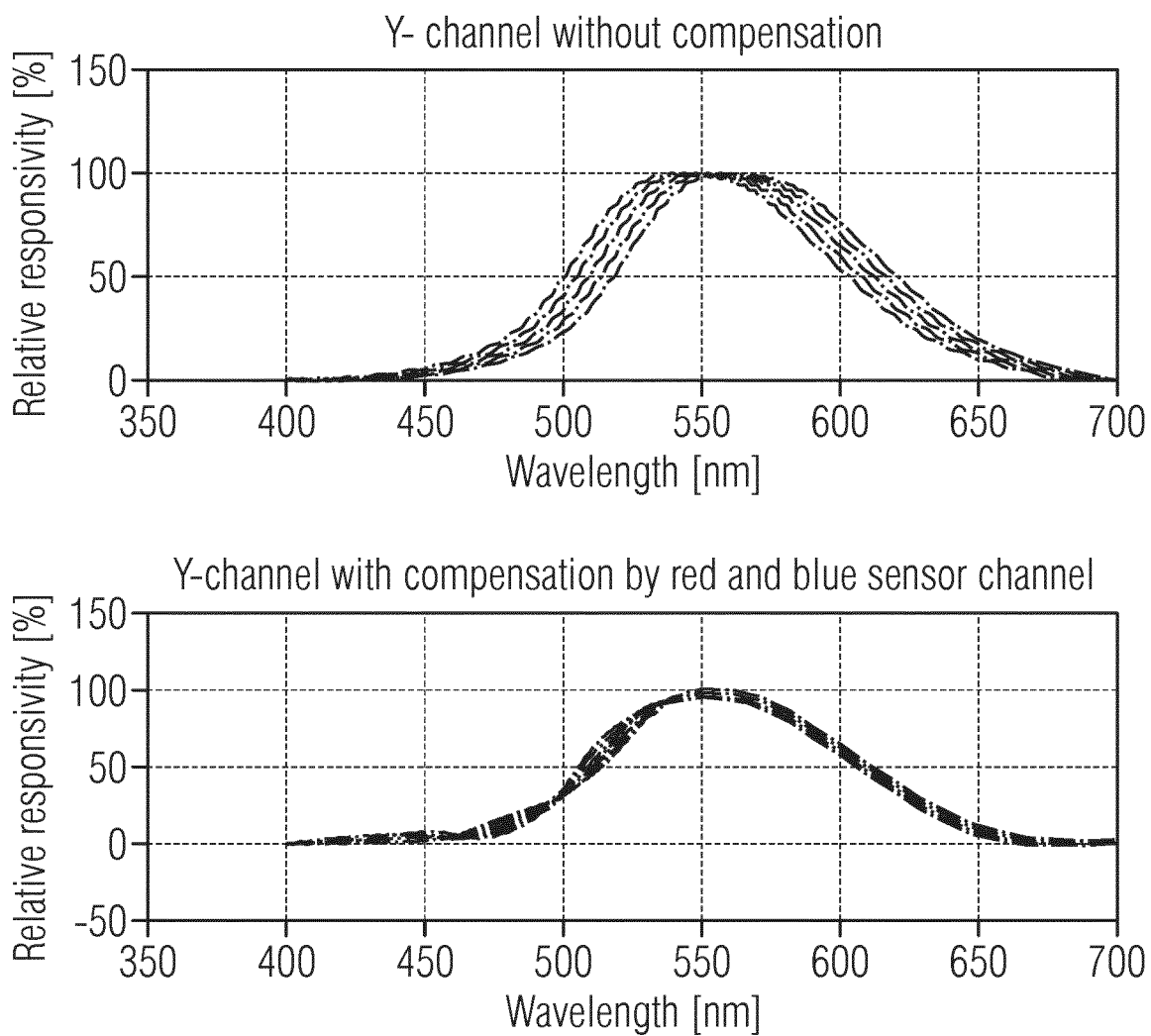
FIG. 6 shows the spectral course of the Y channel without compensation and with a compensation by the red and blue sensor element channel.
Figure 7:
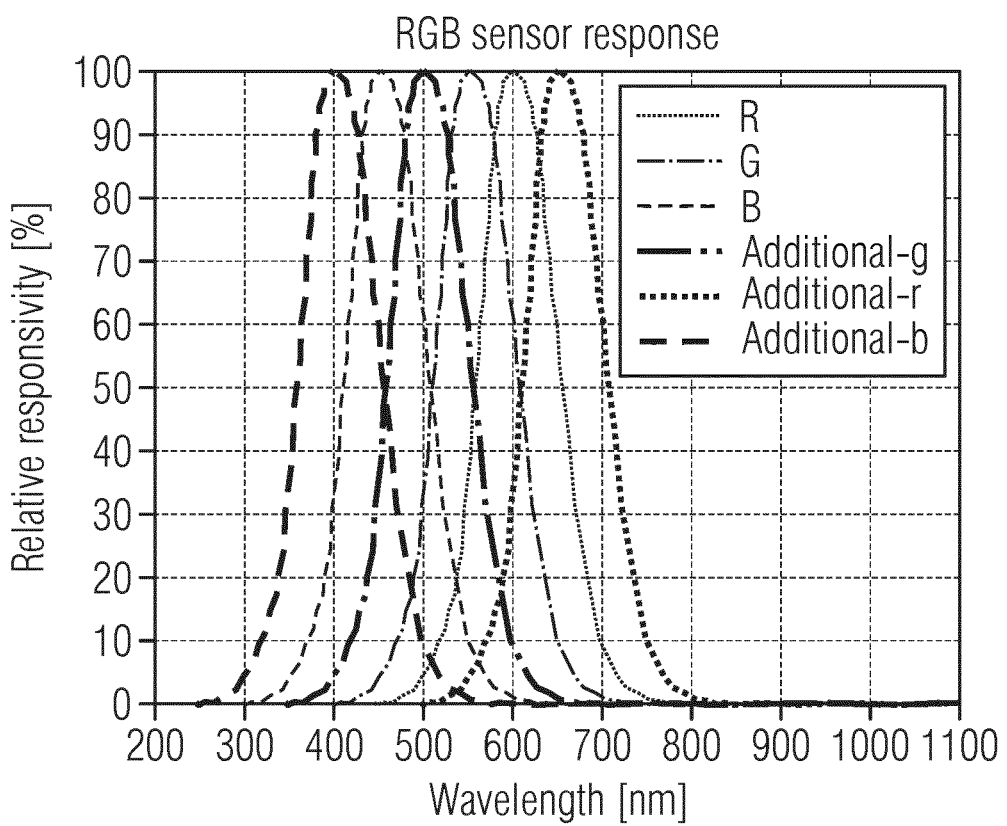
FIG. 7 shows the spectral course of each of an additional red, green and blue sensor measuring channel.
Figure 8:
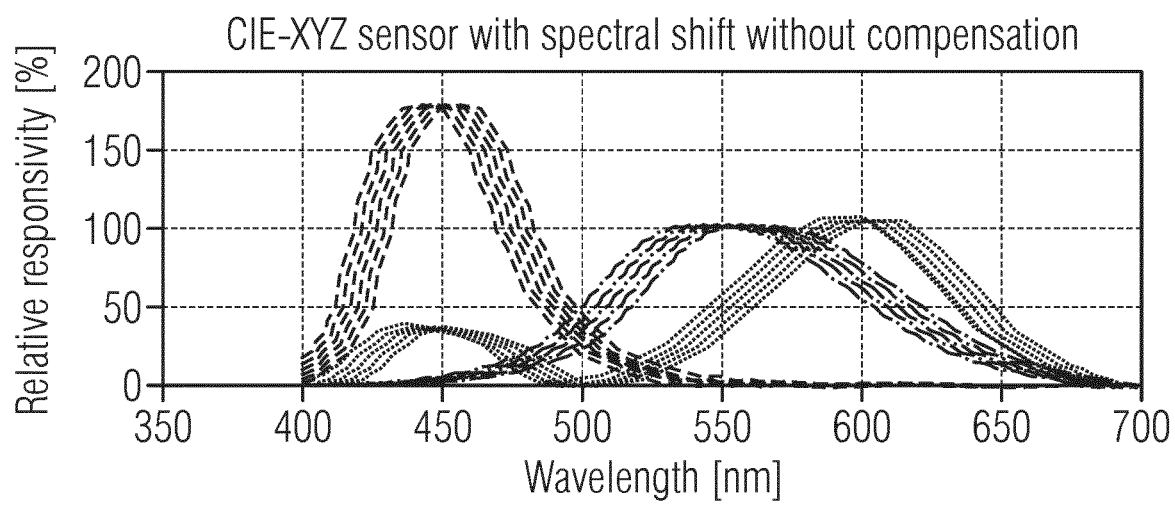
FIG. 8 shows a) the spectral course of a CIE-XYZ color sensor with a spectral shift without a compensation of this shift; b) the same sensor signals from FIG. 7 with only one multispectral compensation of the color channel signals.
Figure 8:
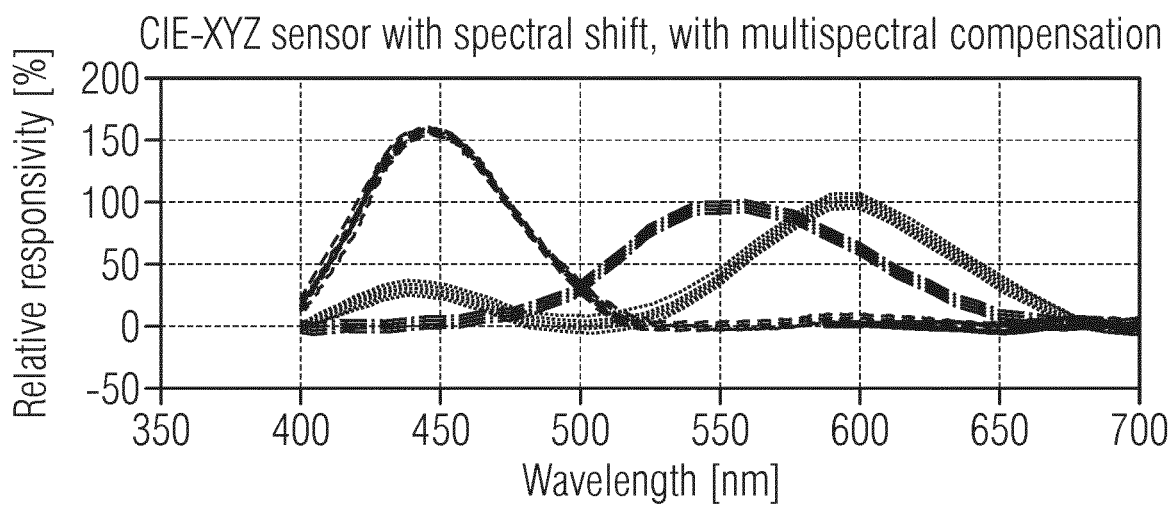

In another advantageous embodiment of the method of the invention spectral fluctuations and tolerances in the production of the color filters and/or of the color sensor are compensated by the transformation algorithm and the transformation parameters. This has the advantage that fluctuations of the individual filter elements can be minimized independently of each other. Amplitude fluctuations can be compensated by an individual weighting/compensation (analog or digital) of the individual sensor elements, e.g., photodiodes. In order to minimize the errors by spectral shifting, it can be advantageous if the filters are not coated independently of each other but rather in such a manner that individual layers of the filters have an identical process step. FIG. 4a shows the sensor output values without a following weighting. The sensor signal is transformed by a transformation algorithm using transformation parameters to an intended sensor signal, i.e., to a desired sensor characteristic (FIG. 4b).

Process fluctuations in the amplitude of the individual color channels can be readily compensated by an analog or digital weighting. Furthermore, it can be advantageous as regards a reduction of process fluctuations to use more than 3 or 4 sensor elements for a calculation of color values and in order to compensate fluctuations in the process. Coatings also have spectral shifts in addition to amplitude fluctuations. A spectral shift can also be achieved by the using of other channels which therefore can also be used for compensating the spectral shift.

In order to improve all channels, not only in amplitude but also as regards the spectral shift, other color channels are needed with a wavelength below the blue channel and one above the red channel.

The problem is solved on the arrangement side by a color sensor with the sensor characteristic of the initially cited type, wherein each sensor element forms a measuring channel and wherein the measuring channels are constructed so that they can be combined or are combinable according to a transformation algorithm that can be filed in the processing unit and according to transformation parameters to an X-, Y- and Z color channel in accordance with the desired sensor characteristic.

The color sensor presented here is an integrated sensor solution, that is, a sensor with several photosensitive sensors (e.g., photodiodes) which are integrated on a chip and which can be combined to an XYZ color sensor by applying different optical filter coatings.

In an advantageous embodiment of the color sensor of the invention the color sensor comprises more than three sensor elements. This has the advantage that assuming an equal variation of the filter elements by using a higher number of measuring channels, i.e. sensor elements, a better compensation of errors relative to production fluctuations can be achieved by a filed, mathematical function or coefficients, i.e. a transformation algorithm or transformation coefficient because an over-compensated system is concerned.

In another advantageous embodiment of the color sensor according to the invention the sensor element is a photodiode.

In another advantageous embodiment of the color sensor according to the invention more than one X color channel and/or more than one Y color channel and/or more than one Z color channel are formed. This also has the advantage that given an assumed equal variation of the filter elements by a higher number of measuring channels, i.e., sensor elements, a better compensation of errors relative to production fluctuations can be achieved by a filed, mathematical function, i.e. a transformation algorithm can be achieved because an over-compensated system is concerned.

In another advantageous embodiment of the color sensor according to the invention spectral influences of a sensor housing and/or production fluctuations in the manufacturing process of the color sensor can be compensated.

Figure 3:
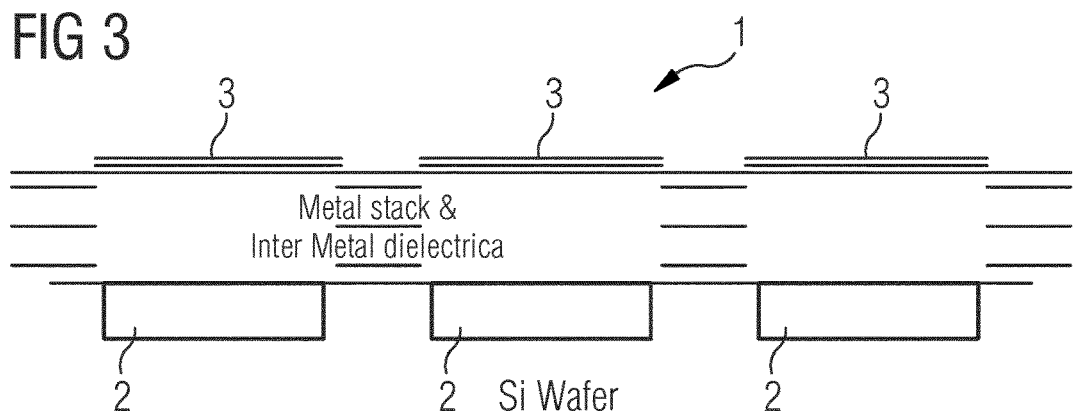
FIG. 3 shows the schematic construction of a color sensor.

The solution according to the invention shows in FIG. 3 how the X channel can be composed by a combination of two differently coated sensors in that a sensor element sensitive to red is combined with a sensor element sensitive to blue (which can also be the Z channel of the sensor). The sensor output signals are subsequently weighted in an analogous or digital manner and combined so that the result is an X channel spectrum. Therefore, more economical ITF filters can be used for producing an XYZ sensor.

Of course, the characteristic of the sensitive sensor elements must always be considered too for the calculation of the spectra, that is, of the resulting sensor characteristic.

In the case of a multi-channel solution there is also the advantage that spectral influences of the housing, that is, e.g. of the sensor cover or cover glass of the housing can be compensated/minimized. Furthermore, a better compensation of errors relative to production fluctuations is achieved with the system with more than three channels since it is an over-compensated system. Sensors are usually hidden behind a housing in order that the sensors are hidden from water or other environmental influences. The transmission of these housings is often not quite constant in the visible spectral range. Spectral influences of the housing can be better compensated by using several channels.

Figure 9:
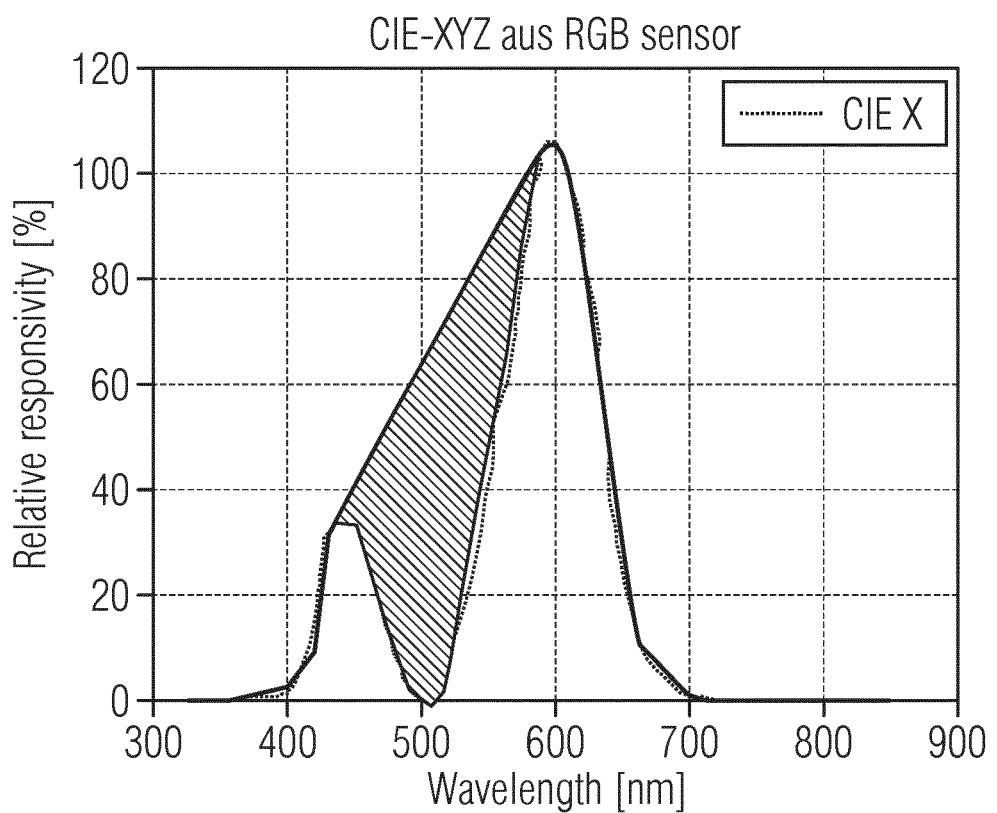
FIG. 9 shows the spectral course of the X channel resulting from a broadband filter and a subtracted component of another filter.

Sometimes it is advantageous if the X channel consists of a broadband filter (in FIG. 9—shown in dashes) for the X channel from which a part with another filter (FIG. 9—shown in shading) is subtracted. The advantage here is the fact that even complex filters can be realized from the above from two or more different bandpass filters.

LIST OF REFERENCE NUMERALS 1 color sensor
2 sensor element
3 color filter, filter element

The invention claimed is:

1. A method for producing an XYZ color sensor with a sensor characteristic which is adjusted by sensor elements which each comprise an element characteristic, and a color filter cooperating with the sensor elements and consisting of color filter elements which each comprise a filter element characteristic, characterized in that the particular filter element characteristics are adjusted in such a manner that they have in cooperation with the respective element characteristic an interim characteristic of the sensor which deviates from the sensor characteristic on the whole, wherein the sensor characteristic is generated from the interim characteristic by a transformation algorithm using transformation parameters, wherein spectral fluctuations and tolerances in the production of the color filters and/or of the color sensor are compensated by the transformation algorithm and the transformation parameters and by using more than three sensor elements that are combined by the transformation algorithm to form X, Y, and Z color channels of the XYZ color sensor.

2. The method for producing an XYZ color sensor with a sensor characteristic according to claim 1, characterized in that the color filter consisting of color filter elements is produced from dielectric and metallic layers alternately arranged on each other.

3. The method for producing an XYZ color sensor with a sensor characteristic according to claim 1, characterized in that the transformation algorithm and the transformation parameters are generated from a simulation of the desired sensor characteristic.

4. A color sensor with a sensor characteristic comprising sensor elements, an optical filter element arranged on each sensor element, wherein each optical filter element comprises a plurality of dielectric and metallic layers which are arranged alternating on each other, and comprising a processing unit, wherein the sensor elements, the filter elements and the processing unit are constructed integrated on a chip, characterized in that each sensor element forms a measuring channel and the measuring channels are constructed so that they are combinable according to a transformation algorithm that can be filed in the processing unit and according to transformation parameters to X-, Y- and Z color channels in accordance with the sensor characteristic, wherein spectral fluctuations and tolerances in the production of the color filters and/or of the sensor elements are compensated by the transformation algorithm and the transformation parameters and by using more than three sensor elements that are combined by the transformation algorithm to form the X-, Y- and Z color channels of the color sensor.

5. The color sensor with a sensor characteristic according to one of claim 4, characterized in that the sensor element is a photodiode.

6. The color sensor with a sensor characteristic according to claim 4, characterized in that more than one X color channel and/or more than one Y color channel and/or more than one Z color channel are formed with the more than three sensor elements.

7. The color sensor with a sensor characteristic according to claim 4, characterized in that spectral influences of a sensor housing can be compensated.

* * * * *